United States Patent
Brittner et al.

(10) Patent No.: US 11,449,245 B2
(45) Date of Patent: Sep. 20, 2022

(54) POWER TARGET CALIBRATION FOR CONTROLLING DRIVE-TO-DRIVE PERFORMANCE VARIATIONS IN SOLID STATE DRIVES (SSDS)

(71) Applicant: Western Digital Technologies, Inc., San Jose, CA (US)

(72) Inventors: Rodney Brittner, San Jose, CA (US); Reed Tidwell, Centerville, UT (US)

(73) Assignee: Western Digital Technologies, Inc., San Jose, CA (US)

( * ) Notice: Subject to any disclaimer, the term of this patent is extended or adjusted under 35 U.S.C. 154(b) by 498 days.

(21) Appl. No.: 16/440,472

(22) Filed: Jun. 13, 2019

(65) Prior Publication Data

US 2020/0393978 A1    Dec. 17, 2020

(51) Int. Cl.
*G06F 1/3221* (2019.01)
*G06F 3/06* (2006.01)

(52) U.S. Cl.
CPC .......... *G06F 3/0625* (2013.01); *G06F 1/3221* (2013.01); *G06F 3/0634* (2013.01); *G06F 3/0679* (2013.01)

(58) Field of Classification Search
CPC ..................................... G06F 1/32; G06F 1/26
See application file for complete search history.

(56) References Cited

U.S. PATENT DOCUMENTS

| | | | |
|---|---|---|---|
| 9,123,400 B1 | 9/2015 | Yang et al. | |
| 9,244,519 B1 * | 1/2016 | Ellis | G06F 1/3253 |
| 9,323,304 B2 | 4/2016 | Salessi et al. | |
| 9,864,423 B2 | 1/2018 | Gara et al. | |
| 9,880,605 B2 | 1/2018 | Thangaraj et al. | |
| 10,168,758 B2 * | 1/2019 | Suryanarayanan | G06F 13/4282 |
| 2005/0289377 A1 * | 12/2005 | Luong | G06F 1/324 713/322 |
| 2007/0126686 A1 * | 6/2007 | Chang | G09G 3/3648 345/98 |
| 2008/0307240 A1 | 12/2008 | Dahan et al. | |
| 2009/0213673 A1 | 8/2009 | Flautner et al. | |
| 2009/0222707 A1 * | 9/2009 | Shin | G06F 11/1004 713/400 |
| 2010/0180150 A1 * | 7/2010 | Jeddeloh | G06F 11/3058 714/E11.054 |
| 2014/0200839 A1 | 7/2014 | Doi | |
| 2015/0309751 A1 | 10/2015 | Ellis et al. | |

(Continued)

OTHER PUBLICATIONS

International Search Report & The Written Opinion of the International Searching Authority dated Apr. 5, 2020, International Application No. PCT/US2019/066420.

*Primary Examiner* — Phil K Nguyen
(74) *Attorney, Agent, or Firm* — Vierra Magen Marcus LLP

(57) ABSTRACT

To provide more uniform performance levels for solid state drive (SSDs), the static power level used by an SSD in an idle state is measured and used to determine a static power offset for each of the drives. The static power offset is set as a parameter for the SSD and used to offset a received power supply level for use on the drive. For a data storage system of multiple SSDs, a common scaling factor can be used to set the degree to which the static power offset is implemented, allowing for a choice between uniformity of power and uniformity of performance for the SSDs of a data storage system.

16 Claims, 13 Drawing Sheets

(56) References Cited

U.S. PATENT DOCUMENTS

| | | |
|---|---|---|
| 2017/0279697 A1 | 9/2017 | Katsaros et al. |
| 2018/0173447 A1* | 6/2018 | Chin .................... G06F 3/0619 |
| 2018/0189135 A1* | 7/2018 | Naik .................... G11C 29/028 |
| 2018/0293029 A1* | 10/2018 | Achtenberg ........... G11C 16/26 |
| 2018/0335977 A1 | 11/2018 | Tidwell et al. |
| 2018/0335978 A1 | 11/2018 | Tidwell et al. |
| 2019/0102097 A1* | 4/2019 | Madraswala ......... G06F 3/0679 |
| 2020/0159446 A1* | 5/2020 | Alsasua .............. G06F 12/1009 |

* cited by examiner

POWER TARGET CALIBRATION FOR CONTROLLING DRIVE-TO-DRIVE PERFORMANCE VARIATIONS IN SOLID STATE DRIVES (SSDS)

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

A solid state drive (SSD) is a solid-state storage device that uses non-volatile integrated circuit memory assemblies as memory to store large amounts of data persistently. Large scale data storage systems can be formed of a number of SSDs. In such systems, the constituent SSD generally are chosen to meet a particular power requirement. However, by designing the SSDs to have a consistent power usage, the SSDs will frequently display a wide drive-to-drive variation in performance, as there is typically a tradeoff between uniformity of power consumption and uniformity of performance.

BRIEF DESCRIPTION OF THE DRAWINGS

Like-numbered elements refer to common components in the different figures.

DETAILED DESCRIPTION

In many applications, it is useful if solid state drives, or SSDs, of a particular design have performance levels that are the same or within a small tolerance of drive-to-drive variations. Natural variations in the manufacturing process of the drives' controller ASICs lead to variation in the power usage in the controller ASICs and, consequently, in the SSD. These power variations are mainly manifested in the static power consumption when the SSD is in an idle state, as in such an idle state the power consumption is mainly due to the drive's controller. In power-limited operation, these power variations translate to performance variations which can be substantial. The following presents techniques to help null out these performance variations and provide matched drive-to-drive performance.

As part of a test process, the amount of power drawn by an SSD while in an idle state is measured. This measured static power of the drive can be compared to a nominal static power function to determine an amount of static power offset for the memory drive. This static power offset value can be stored as a parameter on the SSD, such as by a fuse value set on the drive's controller ASIC. When in operation, the SSD can then offset a received power supply level based on the static power offset value, with the offset power supply level used on the SSD. Each SSD can have its static power offset individually set so that when a number of SSDs are assembled into a data storage system, the drives will display a uniform performance level. Temperature dependence can also be incorporated by determining the static power of a drive at more than one temperature value.

As using the SSDs' individual static power offsets will typically lead the multiple drives of a data storage system to have, as a group, a lower level of performance and display an increased amount of variation in power consumption, a scale factor, or "variable redirect factor", is introduced. This factor can be commonly provided to all of the SSDs of a data storage system by the data storage system's controller to allow the static power offset of each of the SSDs to be fully implemented, not implemented at all, or be implemented to some intermediate amount. For example, the value of the variable redirect factor can be selected by a user of the data storage system to allow for a choice between uniformity of performance and uniformity of power consumption. The combination of the static power offset, which is individual to each SSD, and the variable redirect factor, which is common to all the drives, provides the drives with their respective power target offsets.

By incorporating temperature and power sensor on the SSDs, a closed loop control of the static power levels can be used. By monitoring the temperature and the static power usage on an SSD, the drive's controller can adjust the static power offset levels based on a comparison with a nominal relation between temperature and static power levels.

Figure 1:
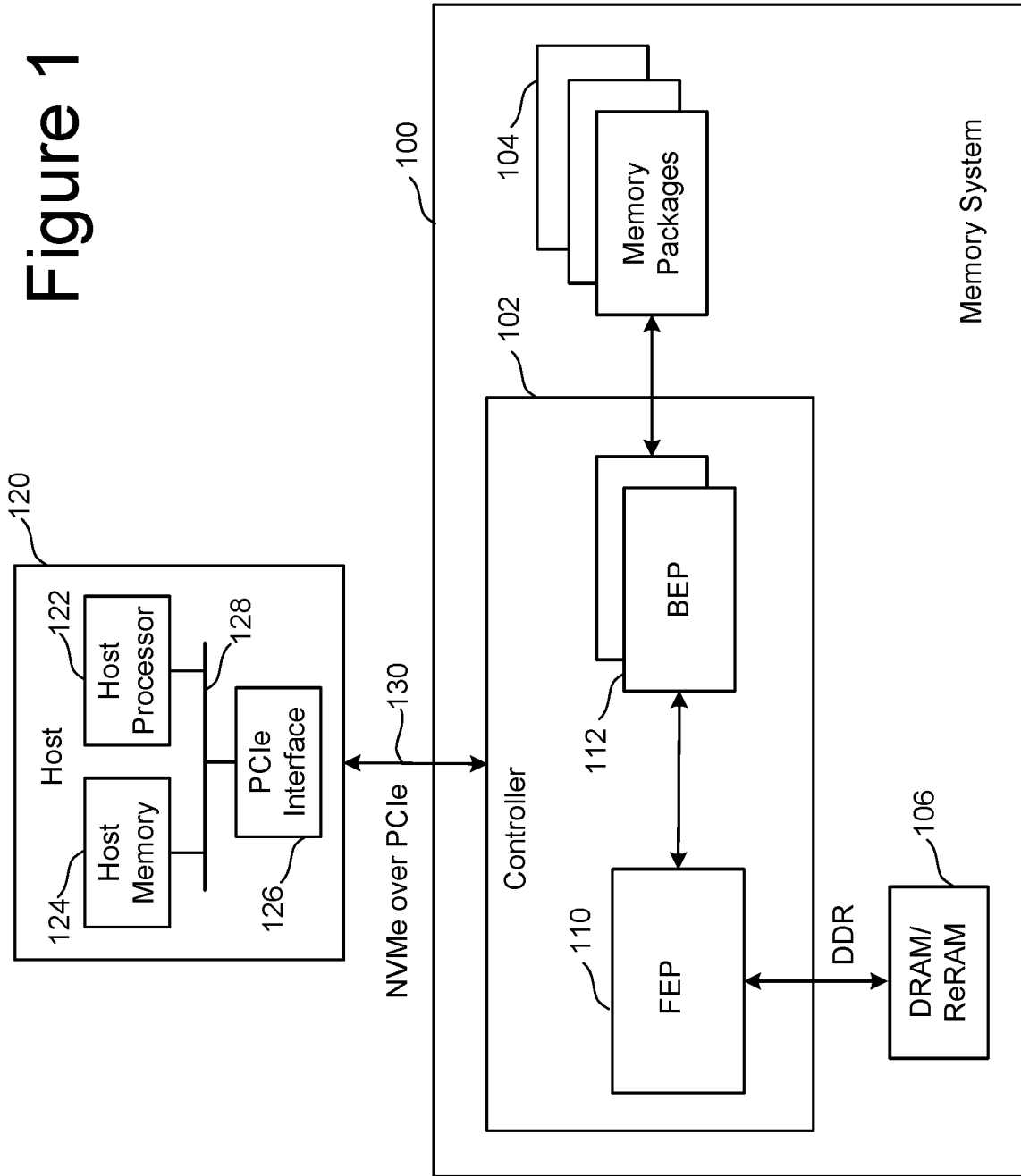
FIG. 1 is a block diagram of one embodiment of a memory system connected to a host.

FIG. 1 is a block diagram of one embodiment of a memory system 100 connected to a host 120. Memory system 100 can implement the technology proposed herein for calibrating performance variations in memory systems. The memory system 100 includes a controller 102 that encodes data streams with a corresponding level of ECC, forms the streams into ECC codewords, forms the codewords into pages, and transfers the pages to memory packages 104 to be written into memory. Many different types of memory systems can be used with the technology proposed herein. Example memory systems include solid state drives ("SSDs"), memory cards and embedded memory devices; however, other types of memory systems can also be used.

Memory system 100 of FIG. 1 comprises the controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. In one embodiment, the ASICs for each of the BEP circuit(s) 112 and the FEP circuit 110 are implemented on the same semiconductor such that the Controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host 120, management of DRAM (local volatile memory), and management of the overall operation of the SSD (or other non-volatile storage system). The BEP circuit(s) 112 manages memory operations in the memory packages/die at the request of FEP circuit 110. For example, the BEP circuit(s) 112 can carry out the read, erase, and programming processes. Additionally, the BEP circuit(s) 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory of memory packages 104 comprises a plurality of memory packages. Each memory package includes one or more memory die. Therefore, Controller 102 is connected to one or more non-volatile memory die. In one embodiment, each memory die in the memory packages 104 utilize NAND flash memory (e.g., two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. In one embodiment, host 120 is external to and separate from memory system 100. In another embodiment, memory system 100 is embedded in host 120.

Figure 2:
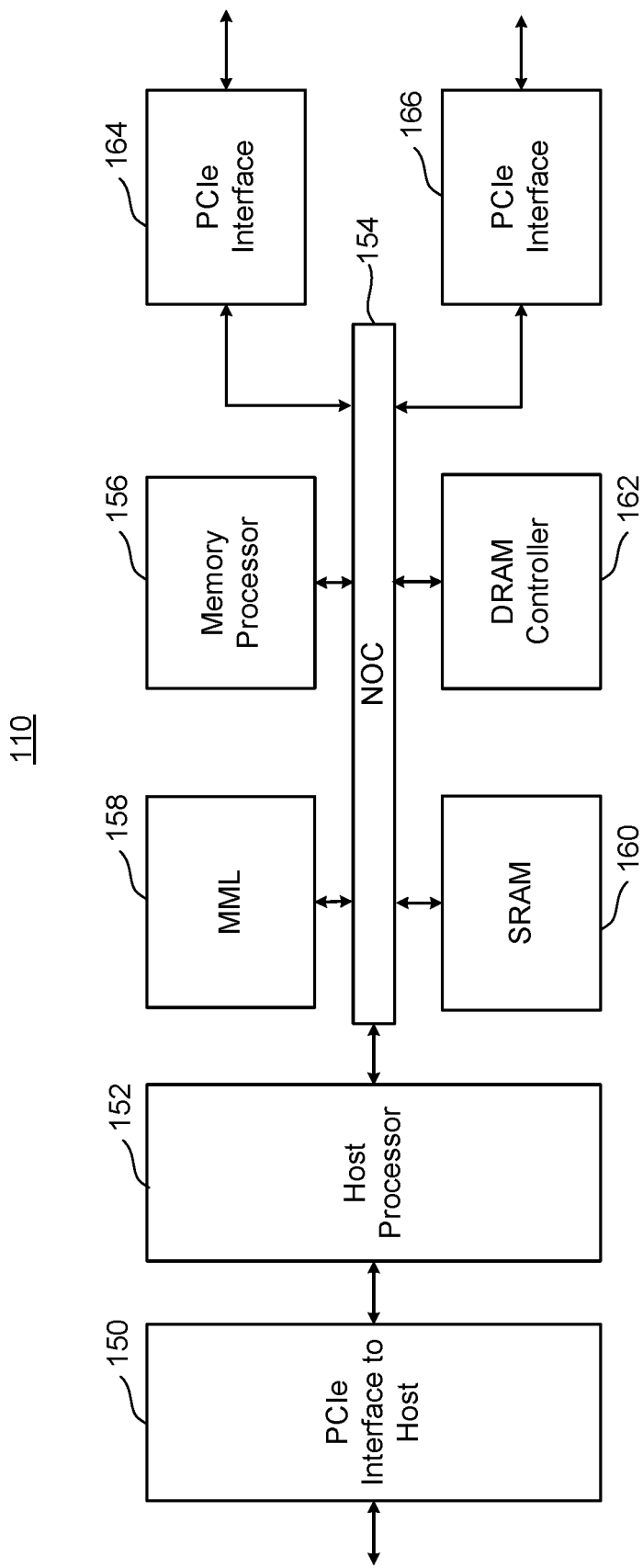
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface 150. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC 154 are shared by many signals. A high level of parallelism is achieved because all links in the NOC 154 can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is a memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC 154 are two PCIe Interfaces 164 and 166. In the embodiment of FIG. 2, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML 158 may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate writes from the host into writes into the memory structure.

Figure 3:
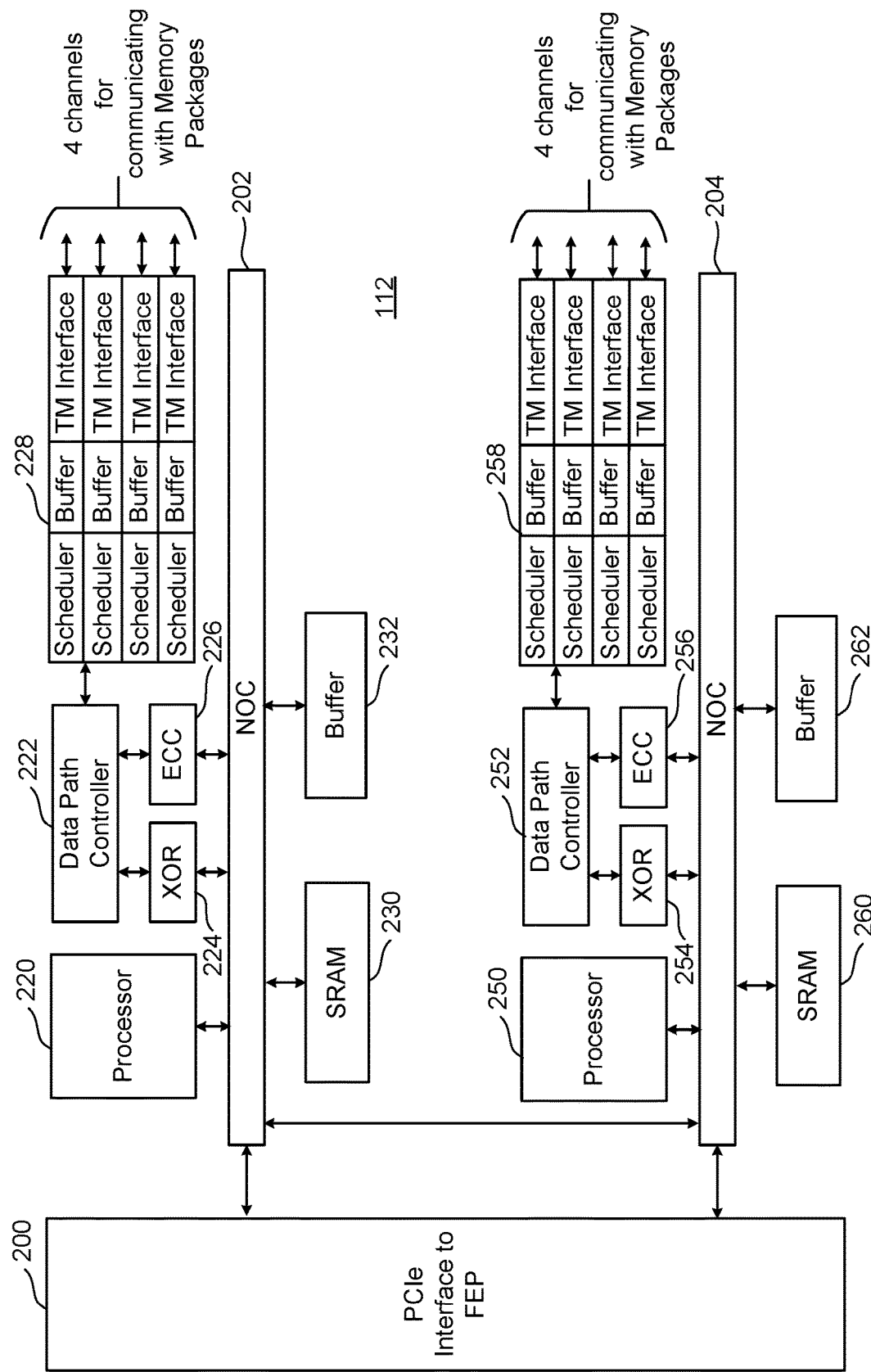
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), a processor (220/250), and a data path controller (222/252) via an XOR engine (224/254) and an ECC engine (226/256). The ECC engines 226/256 are used to perform error correction, as known in the art. SRAM 230/260 is local RAM memory used by memory processor 220/250. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. In certain embodiments, the XOR engines 224/254 and ECC engines 226/256 are dedicated hardware circuits, known as hardware accelerators. In other embodiments, the XOR engines 224/254 and ECC engines 226/256 can be implemented in software. Embodiments of the ECC engines 224/254 are discussed further below, with respect to the use of "vertical ECC". The scheduler, buffer, and TM Interfaces are hardware circuits.

Figure 4:
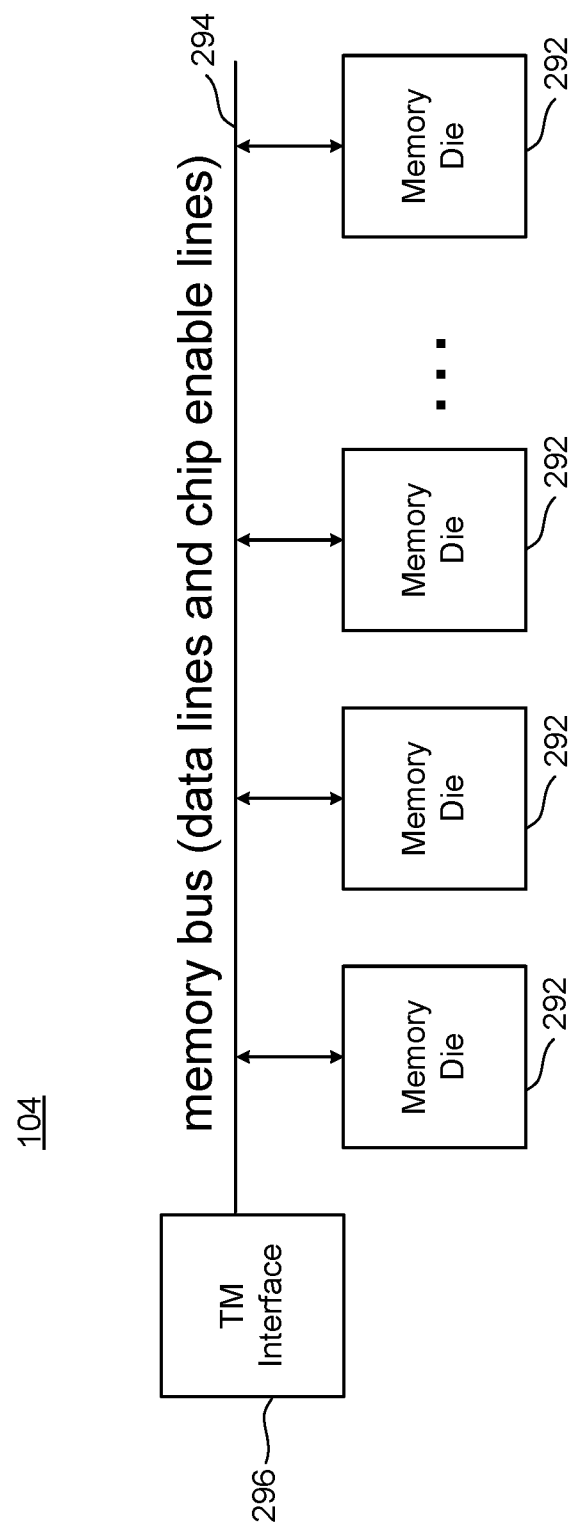
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package 104 can include a small controller connected to the memory bus and the TM Interface. The memory package 104 can have one or more memory die 292. In one embodiment, each memory package 104 includes eight or 16 memory die; however, other numbers of memory die can also be implemented. The technology described herein is not limited to any particular number of memory die.

Figure 5:
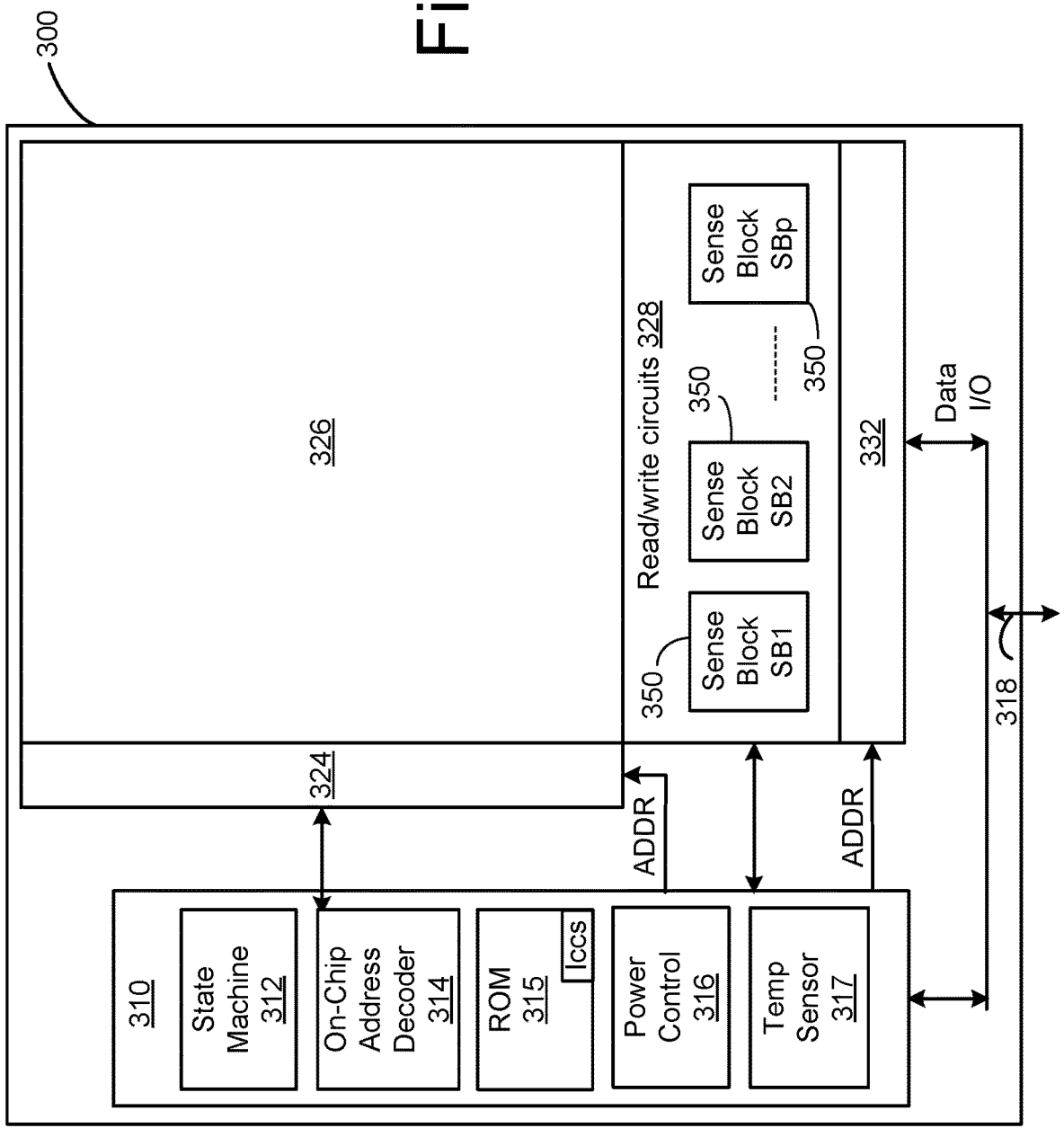
FIG. 5 is a block diagram of one embodiment of a memory die.

FIG. 5 is a functional block diagram of one embodiment of a memory die 300 (e.g., the memory die 292 in FIG. 4). The components depicted in FIG. 5 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the Controller 102 (in FIG. 1) and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, a power control circuit 316, and a temperature sensor circuit 317. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM 315 and other storage devices for storing default values such as base voltages and other parameters. Temperature sensor circuit 317 detects current temperature at memory die 300.

The on-chip address decoder 314 provides an address interface between addresses used by the Controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" refers to a controller (e.g., 102), a state machine (e.g., 312), a micro-controller and/or control circuitry (e.g., 310), or other analogous circuits that are used to control non-volatile memory.

In one embodiment, memory structure 326 comprises a three dimensional memory array of non-volatile memory cells in which multiple memory levels are formed above a single substrate, such as a wafer. The memory structure 326 may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 326 include two dimensional arrays, three dimensional arrays, cross-point arrays, stacked two dimensional arrays, vertical bit line arrays, and the like.

One example of a ReRAM, or PCM cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store data. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 6:
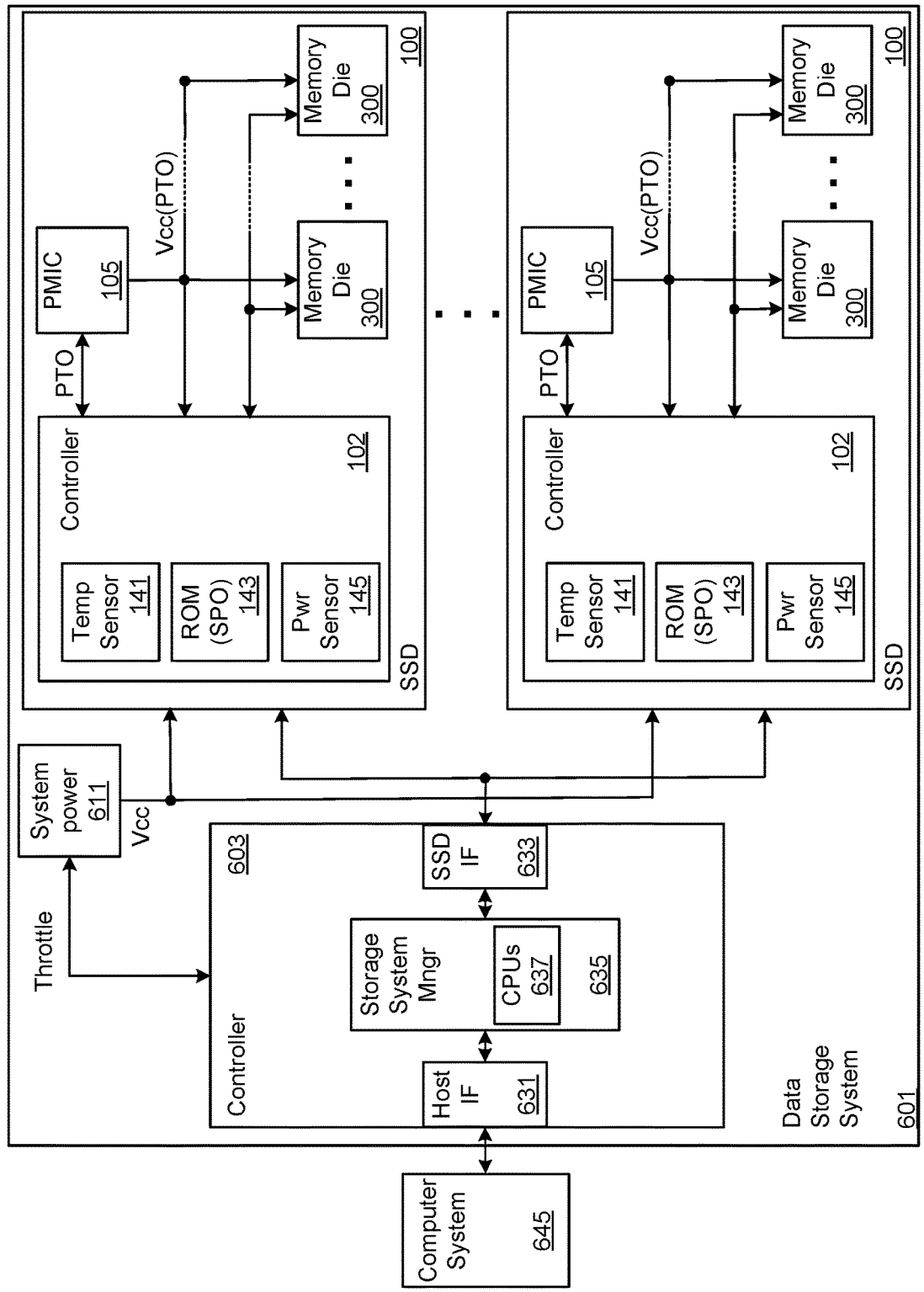
FIG. 6 illustrates an embodiment of a high capacity data storage system having a number of SSDs and a storage system controller.

To form an even higher capacity memory system, a number of solid state drives such as the memory system 100 can be combined into a larger system. Such a data storage system can include multiple SSDs, each acting as a separate data channel, overseen by a storage system controller. FIG. 6 illustrates an embodiment of such a system.

FIG. 6 illustrates an embodiment of a high capacity data storage system 601 having a number of SSDs 100 and a storage system controller 603. The storage system 601 is connected to computer system or other host 645 and includes a number of SSDs or other memory systems 100, such as described above with respect to FIGS. 1-5, where two memory systems 100 are shown but a data storage system 601 may contain a much larger number. The memory systems 100 will be referred to as SSDs, but other embodiments may use other memory drive types. Relative to FIGS. 1-5, the representation of FIG. 6 simplifies the SSDs 100 to highlight some of the elements that entering the following discussion.

As represented in FIG. 6, each of the SSDs 100 includes a number of memory die 300, which can be arranged as memory packages, and a controller 102. The controller 102 in this embodiment can include a temperature monitor or sensor 141 and an on-board power sensor 145, where other embodiments that include these sensor can place these or additional sensor elsewhere in the drive 100. (For example, the temperature sensor can be the temperature sensor 317 on a memory die and the power sensor located on the power module 105.) The controller 102 can also maintain a Static Power Offset (SPO) parameter value 143, that can be a fuse value in a ROM memory whose use will be discussed below. The SSD 100 also includes a power module integrated circuit PMIC 105, that can be consider part of the control circuits of the memory drive. PMIC 105 is here represented as a separate integrated circuit, but in other embodiments can be part of a controller ASIC. PMIC 105 provides the voltage levels for the SSD 100, including the high voltage level Vcc, which can be a function of a Power Target Offset (PTO), Vcc(PTO). The power target offset PTO value is related to the static power offset SPO of 143 and, in some embodiments, the Variability Redirect Factor (VRF) value as received from the storage system controller 603, where these concepts are developed in more detail in the following.

The storage system controller 603 oversees the operation of the data storage system 601, where each of the SSDs 100 can be used as a separate memory channel by way of the of the storage medium interface 633. A host interface 631 is configured for communicating with a computer system 645 or other host. A management module 635, including one or more CPUs 637, are configured to perform the various controller functions, including those related to power target calibration as described in the following. These function can be implemented through various combinations of firmware, hardware, and software as implemented in the processing units 637. A system power module 611 can provide the high supply level Vcc to the SSDs 110 and the storage system controller 603, along with other supply levels that might be used on the data storage system. The system power module 611 can be controlled by the storage system controller 603 and be used to provide a fixed Vcc level, or the Vcc level may vary be varied by the storage controller for purposes of "power throttling", as described in more detail below. The system power module 611 can be considered part of the system control circuits and although represented as a separate element in the embodiment of FIG. 6, in other embodiments it can be incorporated into other system control elements.

The following discussion is primarily presented in the context illustrated with respect to FIG. 6, namely of a data storage system of one or more solid state drives, and considers the use of calibrating a power target for controlling such solid state drives. However, the technique can be applied to other forms of drives or even other devices that have multiple copies of an integrated circuit that display device to device variance in power usage and that are formed into a larger systems of multiple such devices.

Continuing in the context of an embodiment for a data storage system formed of multiple solid state drives of a particular type, in terms of volume and other characteristics, these SSDs are often designed and built to meet a particular power rating. However, by having the SSDs meet a power rating value with a tight distribution of values, the drives will tend to display a wide variation in performance, such as measured by the rate of input/output operations that the SSD can maintain. This relationship can be illustrated by reference to FIGS. 7 and 8.

Figure 7:
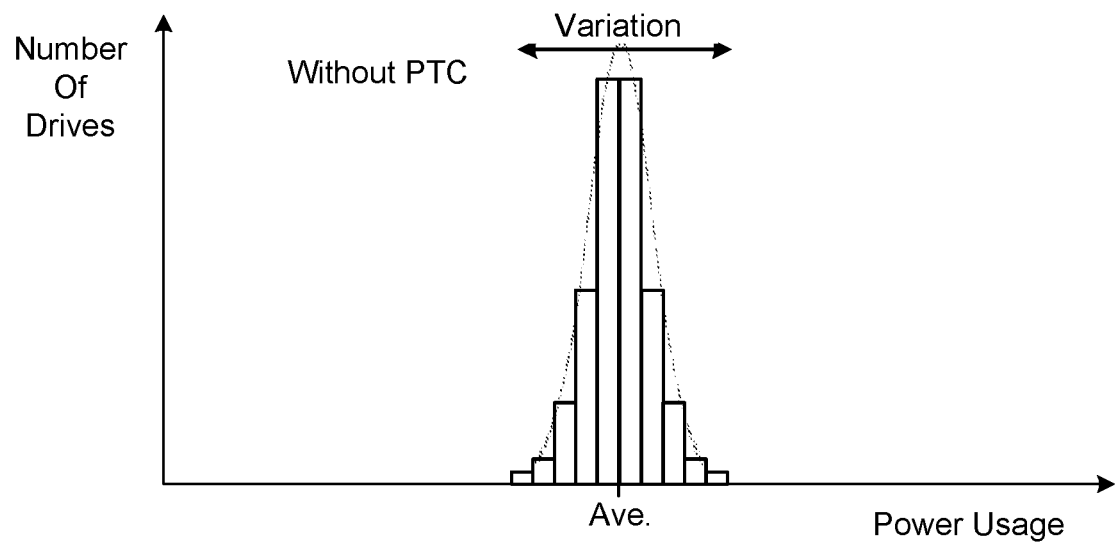
FIGS. 7 and 8 respectively illustrate distributions for the number of drives versus power usage and performance of a set of SSDs optimized for meeting a power specification.
Figure 8:
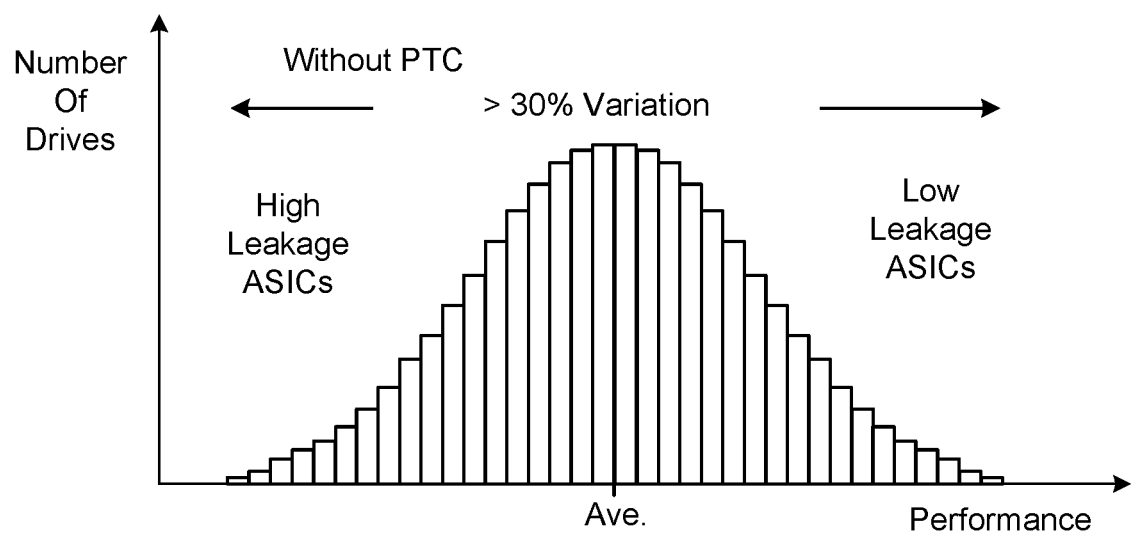

FIGS. 7 and 8 respectively illustrate distributions for the number of drives versus power usage and performance of a set of SSDs optimized for meeting a power specification. As illustrated in FIG. 7, the SSDs have been selected so that the distribution of drives centered on an average value, corresponding to a nominal power specification, with a very narrow spread to meet the required tolerance of drive-to-drive variation about the specified power value. By focusing on power consumption, however, the drives will exhibit a large amount of variation when it comes to performance levels. FIG. 8 illustrates a distribution of the number of drives versus performance for the same set SSDs as illustrated in the power usage distribution of FIG. 7. The performance distribution of FIG. 8 shows a broad spread about the average performance value, typically with a variation of 30% or more. Drives having controller ASICs with high current leakage values generally display lower performance than drives whose controller ASICs have lower current leakage levels.

In many applications, it is useful if the SSDs of a particular model have performance that is the same or within a small tolerance of drive-to-drive variation. Natural variations in the manufacturing process of the SSDs' controller ASICs lead to variation in the power usage in these ASICs. In power-limited operation, these power variations translate to performance variations which can be substantial, as illustrated by FIG. 8 where the high current leakage controller ASIC can exhibit significantly lower performance levels that for low leakage devices.

The following present techniques to null out these performance variations, providing matched drive-to-drive performance. As developed in more detail below, the variation in performance can be made more uniform by dialing back the performance of the higher performing, typically low leakage, SSDs. This is presented in FIG. 9.

Figure 9:
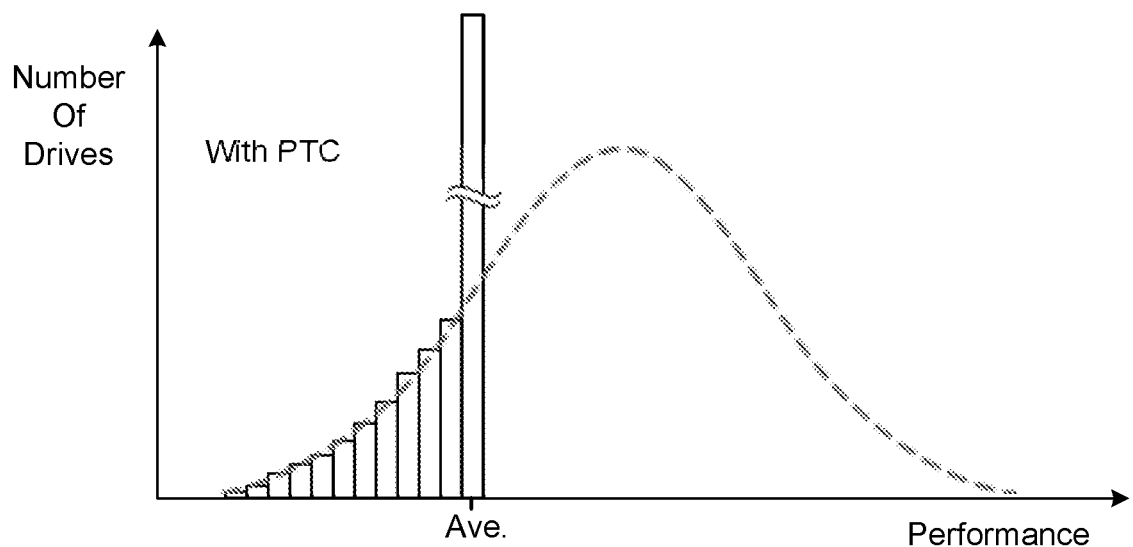
FIG. 9 illustrates a distribution of SSDs versus performance with the use of power target calibration.

FIG. 9 illustrates a distribution of SSDs versus performance when using power target calibration. In FIG. 9, the bottom end of the distribution is the same as for FIG. 8. The upper end of the distribution in FIG. 8, however, has now been pushed down to be at or below the performance value at the spike of the distribution. This can be used to reduce the variation in performance to a much lower value than in FIG. 8, such as 10% for example, by suitably limiting the upper performance levels. There is a tradeoff in that the average performance is lowered and, as illustrated in FIG. 10, that there is a spread in the distribution of power usage values.

Figure 10:
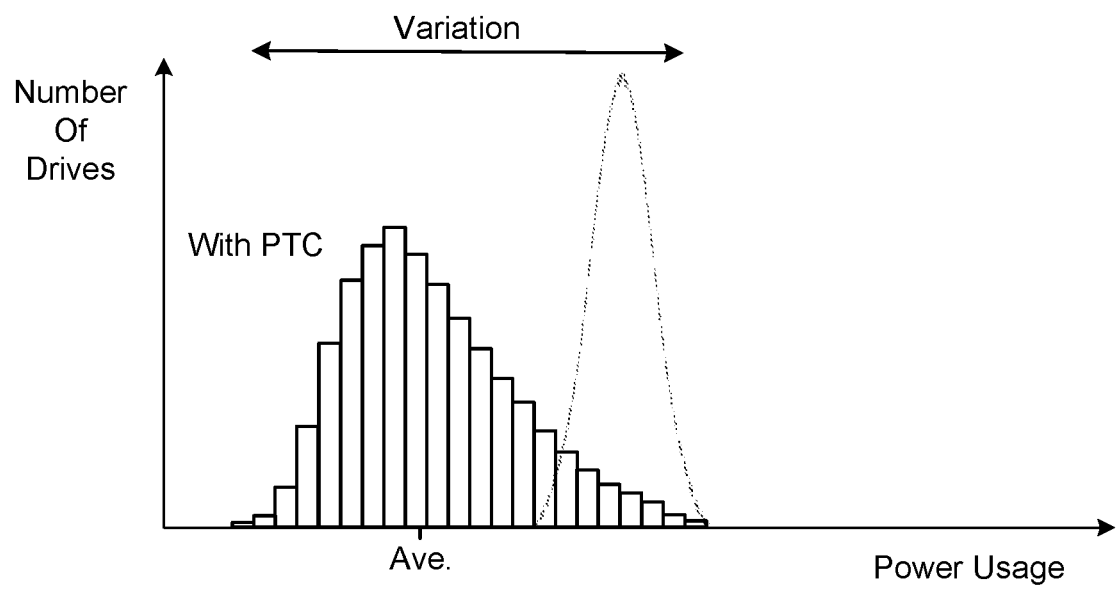
FIG. 10 illustrates a distribution of SSDs versus power when power target calibration is used.

FIG. 10 illustrates a distribution of SSDs versus power when power target calibration is used. By narrowing the variation in performance, the power distribution is spread out. As the SSDs with higher performance controller ASICs have their performance scaled back to varying degrees, the power usage distribution is spread out and moved down. In some of the embodiments presented below, the amount of power target calibration can be scaled to provide a desired balance between performance and power averages and variation.

One approach that can be used to mitigate performance differences is to vary the power supply level or levels (e.g., Vcc) that the system power module 611 for FIG. 6 supplies to the SSDs 100. This can allow for higher power (fast) parts to run at a lower voltage to save power, bringing their power dissipation closer to the lower power (slow) drives, which have a higher voltage in order to meet timing. Although effective to some extent, the power draw is still not equalized and, for some voltages (such as interface voltages) that have very limited swings, the requirements of these elements may not be met if the supply level is scaled back too much. Additionally, by using an open-loop power management technique, where performance is fixed for all drives in order to guarantee that the power limits are not exceeded, performance must be constrained based on worst case conditions (fast process, high temperature). This means that performance is over-constrained under typical conditions, meaning reduced performance most the time.

Embodiments for the power target calibration techniques presented here can include a number of features for controlling drive-to-drive performance variations in SSDs that can overcome the limitations of previous approaches. A first of these is a static power measurement for each of the SSDs, where the static power is the "fixed" portion of the power drawn by the SSD when in an idle state and is largely due to the usage of the controller ASIC (or ASICs), as opposed to the drive's variable dynamic power that mainly goes to operation on the memory die. After a drive is assembled from a set of memory dies and one or more controller ASICs, during a testing process the static power of each drive is measured at production test under controlled conditions, where this can include measuring the SSDs static power when the drive is in an idle state at a number of temperatures. In this way, in addition to the usual device characterizations the static power level is determined.

Based on the characteristics of a distribution of a set of drives of the same specification, a nominal static power function can be developed in terms of static power vs. temperature. This represents the standard for static power and for performance. This power function will usually be near to or slightly below the static power function of the drives with the most static power. The static power measured for the drives of this specification are compared to this standard to determine a static power offset (or SPO, as shown at 143 of FIG. 6), where the drive itself can be used as one of the set of drives used to nominal static power function or these function can have been previously determined for the SSDs of this specification.

The static power offset of a drive is the difference between the static power measurement and the nominal static power function. It is the how much the power target for a particular drive must be changed in order for it to have the same performance as a nominal drive (drive with the nominal static power function). The static power offset of the drive can then be stored on the SSD, such as by a fuse value in ROM memory 143 of the drive's controller ASIC.

In some embodiments, a scale factor, or Variability Redirect Factor (VRF), can be used. The variability redirect factor is a number between 0 and 1 that is used to scale the static power offset to determine the power target offset. A value of 0 effectively disables power target calibration, by forcing the power target offset to 0. A VRF of 0.5 means that the power target offset will be half of the static power offset. This is useful because use of the power target offset has the tradeoff of lowering the fleet average performance. Some use cases may want the highest average performance at the expense of more performance variation. Others may want the lowest possible performance variation at the expense of lower average performance, and some may need something in between. Use of the VRF means that all drives can have the same method to determine the static power offset, but have varying levels of power target offset, depending on the application. As illustrated in the embodiment of FIG. 6, the same VRF is supplied to all of the SSDs 100 of the storage system controller 603 by the data storage system 601, but in other embodiments the storage system controller could issue different VRF values to individual drives or sets of drives. Depending on the embodiment, the VRF value could be a set parameter on the storage system controller 603 or could be user adjustable.

The power target offset (or PTO in FIG. 6) of a drive is the power offset that is applied to modify the power target (a maximum power limit) of a memory drive. It is derived using the static power offset, which varies from drive to drive, and the variability redirect factor that can be shared by the drives of a data storage system. For example:

$$\text{Power Target Offset} = \text{Static Power Offset} * VRF.$$

As illustrated in FIG. 6, an SSD 100 receives the high supply voltage Vcc for the data storage system from the power module 611 and VRF value from storage system controller. For the SSD's static power offset value 143 and the received VRF value, the drive's controller 102 can then determine the power target offset. Based on the power target offset, PMIC 105 can then provide an offset supply voltage Vcc(PTO) for use of the controller ASIC (or ASICs) 102 and the memory dies 300.

A data storage system level calibrated power target can also be included into the embodiments described here. The data storage system power target is a maximum power limit for the data storage system 601 that can be used to activate a system power throttling, in which the power level Vcc from the system power module 611 for the data storage system 601, and which is shared by all of the SSDs 100, is adjusted. The degree of throttling at the data storage system level can be determined by the storage system controller 603 from a power state table, for example. Power target correction modifies this table by subtracting the power target offset from the nominal power limit that is used by the system power module 611. Power throttling can be done based on this modified power target.

At the drive level, power target calibration can be used to give each drive 100 the same amount of active power: If each drive has the same amount of dynamic power, then the performance will be substantially the same. To ensure that each drive 100 has the same available dynamic power, the power limit is adjusted to account for the static power consumed by each drive. Drives that consume less static power have their power limit adjusted such that they have the same amount of dynamic power as drives with more static power. This can be illustrated with respect to FIGS. 11A and 11B.

Figure 11A:
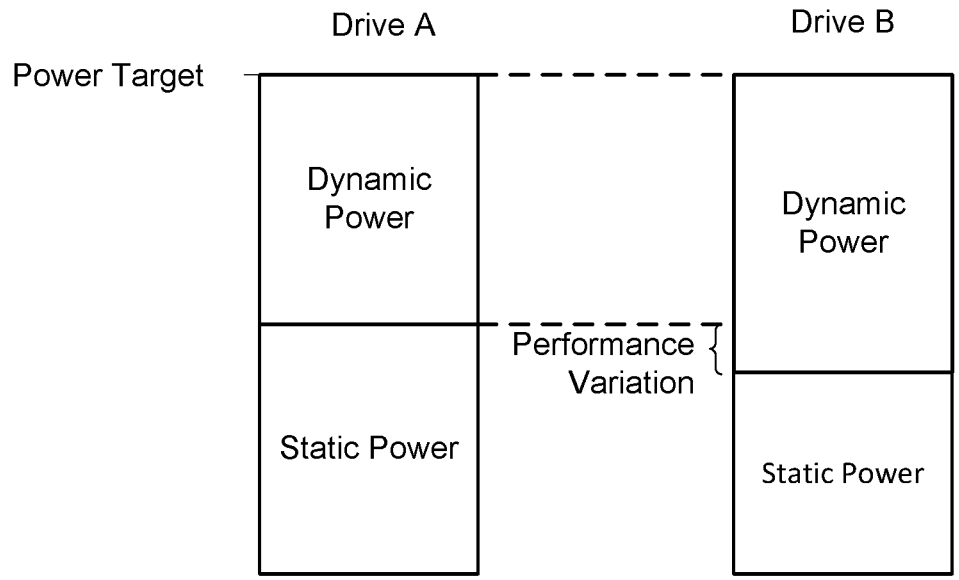
FIGS. 11A and 11B illustrate two drives with different proportions of dynamic and static power respectively without and with power transfer calibration.
Figure 11B:
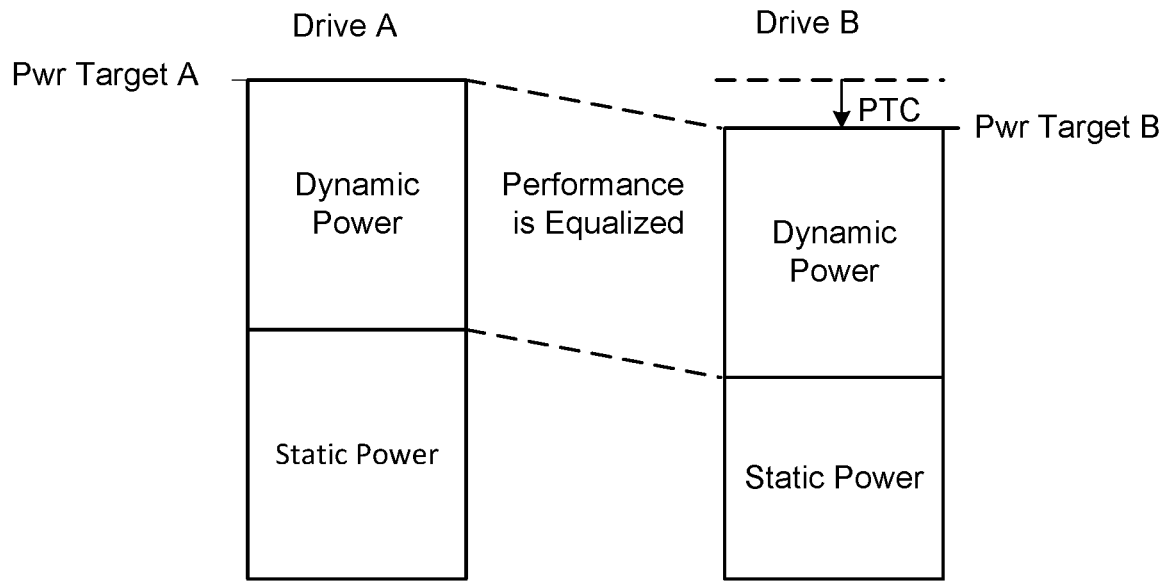

FIGS. 11A and 11B illustrate two drives with different proportions of dynamic and static power without and with power transfer calibration, respectively. Both of FIGS. 11A and 11B show two drives, Drive A and Drive B, that have a power target made up of a static power portion and a dynamic power portion. The static, or idle, power is a fixed amount of power used with the drive is in operation and largely due to the power consumption of the drive's controller ASIC (or ASICs) 102, which can vary from one controller ASIC to another mainly based on current leakage. The dynamic power is the available power by use in memory operations. As shown in FIG. 11A, both of Drive A and Drive have the same power target when power target calibration is not being used. As the static power of Drive A is greater than the power of Drive B, but the power targets are the same, this results in Drive B having more dynamic power as illustrated by the indicated performance variation.

In FIG. 11B, power target calibration is applied, with each drive having its own power target. Relative to the power target A of Drive A, power target calibration reduces the power target B of drive B. This allows for the amount of dynamic power available to each of the drives to be aligned, equalizing performance. (In this example, the variable redirect factor is set to 1, VRF=1, to fully implement the offset.)

As described above, and developed further in the flows presented below, this offset is accomplished by measuring the static power of each drive during a production test at a controlled temperature. A target static power level is set based on the characteristics of a population of drives. This power level will usually be equal or only slightly below the static power of the drives with the most static power. The static power of each drive can then be compared to the target, and a drive's offset is calculated based on the difference.

In the primary embodiments described here, the offset is applied to the drive as a whole (both the controller ASIC and the memory die), even though the variation in static power largely depends on the controller. The controller component is the main variable in this regard, and can be thought of as a variable on an otherwise "fixed" power component, with the controller ASIC itself taking up basically a fixed piece of the whole drive power. The remaining power budget is dynamic power that can used by the memory dies. The power target calibration adjusts the target power for the whole drive with the objective of reducing variation in the remainder, which is the dynamic power that can be applied to memory dies, which the primary concern of a user of the memory drive. Drive performance variation, based on the remaining, dynamic power for the memory dies, is therefore more controlled and provides a user with better consistency.

The static power offset determined at production test can be recorded permanently on a drive's controller ASIC 102, for example, using fuses in the controller ASIC as illustrated at 143. At boot time, the offset is read by firmware. Each time the maximum power is set or changed, such as when changing power states, the offset is subtracted from the maximum power limit. In this way, at each power state, the drive will have the same active power available as all other drives, and thus the performance will be the equalized. Under this arrangement, under power limited conditions, the drive-to-drive power is different, but the drive-to-drive performance is the same. In non-power-limited conditions, performance is limited by some other factor, and will thus also be the same.

As performance is over constrained in the most power-efficient drives, the mean fleet performance will be reduced somewhat. There may be users for which the mean performance is relatively more important than performance variability. In such cases, it may be beneficial to reduce the effect of the power offset, or to eliminate its effect completely. To facilitate this, the Variability Redirect Factor (VRF) is introduced. The VRF is a number between 0 and 1 that is set at run time and scales the offset. Thus, if the VRF is 0, the offset has no effect. If VRF is 1 the offset has full effect. If VRF is 0.75 then the offset has ¾ effect and so on. By this means, the variability in controller ASIC static power can be directed to be manifest as variation in power, variation in performance, or in a fine-grained, tunable combination of the two.

Figure 12:
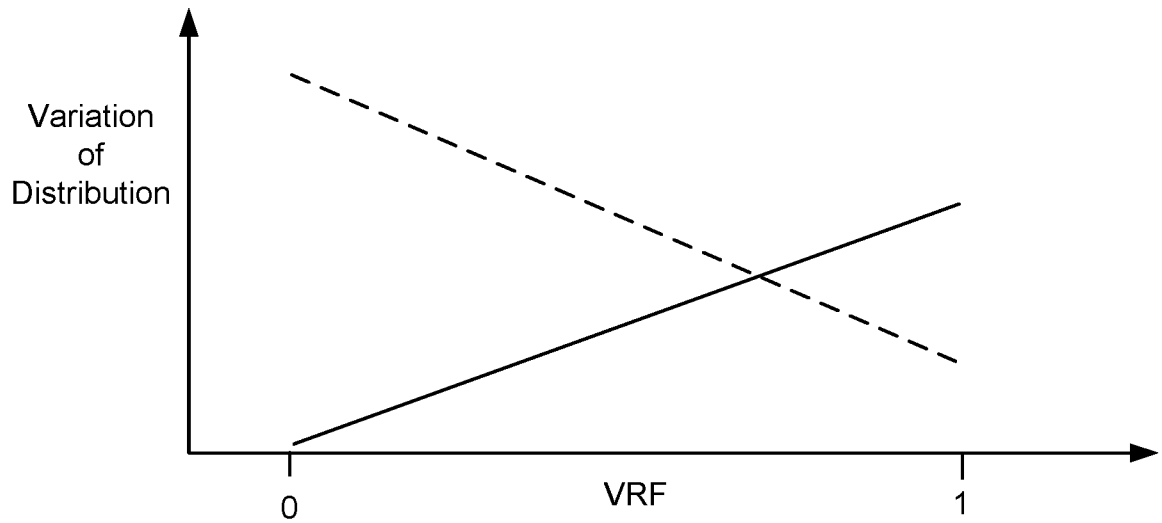
FIG. 12 is a schematic representation of the use of the variability redirect factor and how this affects the variation in power and the variation in performance for a set of drives.

FIG. 12 is a schematic representation of the use of the variability redirect factor and how this affects the variation in power and the variation in performance for a set of drives. As the VRF value is increase from 0 to 1, the variation in performance is decreased, going from a distribution like that illustrated in FIG. 8 to that illustrated in FIG. 9. For the variation in power, as the VRF value is increased from 0 to 1, the variation in power consumption increases, starting from the tight distribution of FIG. 7 to the wider distribution of FIG. 10.

The behavior of circuits such as the controller ASIC vary with temperature. For example, at higher temperatures ASICs tend to exhibit higher leakage rates and consequently consume more power. To account for the temperature dependence, the measurement of static power of a drive at production test can be performed at multiple temperatures. This can allow for the characteristics of an individual drive as a function of temperature to be determined and also for the nominal static power function to be determined as a function of temperature. Based upon these determinations, the static power offset of a drive as a function of temperature can be established. By inclusion of a temperature sensor, such as the temperature sensor 141 on the controller ASIC 102, on the memory drive 100, these temperature dependences can be incorporated into the power target calibration techniques.

Figure 13:
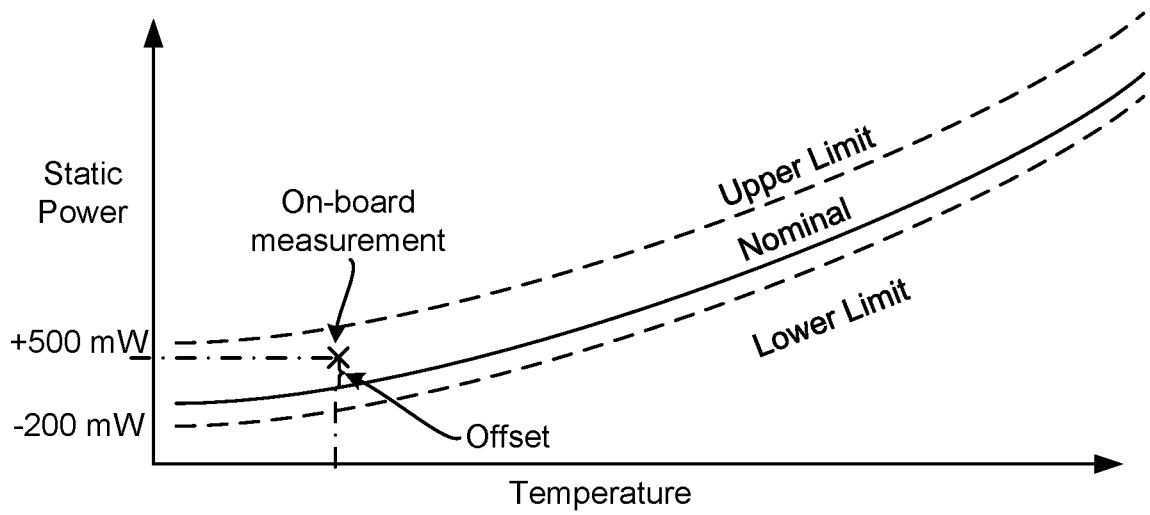
FIG. 13 illustrates a relationship between temperature and power consumption for a solid state drive.

FIG. 13 illustrates the relationship between temperature and power consumption. As shown on FIG. 13, as the temperature increases, the static power level increases with increasing slope over temperature range. For the static power curves, the nominal curve is bounded above and below by an upper and lower limit. The temperature versus static power curves can be established as part of the device characterization for the drives as part of the test process and then used to determine the static power offset of each of the drives. By including a temperature sensor on the drive, such as the temperature sensor 141 on the drive's controller ASIC 102 of FIG. 6, the drive controller 102 can use the temperature value to select the static power offset value appropriate for the temperature value.

For the example of FIG. 13, a temperature Ti corresponds to a static power level of Pi, where the power level can be measure by an on-board power sensor 145 and temperature can be measured by the temperature sensor 141. Pi is above the nominal curve by an amount indicated as the offset. Consequently, this can be the amount of offset used to set the power target for the corresponding drive. Based upon the curves of FIG. 13 and values from the temperature sensor 141 and power sensor 145, the SSDs controller 102 monitor the power and temperature values in a closed loop processes to determine the power target offsets for the data storage system 601. In some embodiments, temperature and power consumption for the data storage system 601 as a whole can also be determined by storage system controller 603 for data storage system level closed loop control of the throttling of the supply level from the system power module 611, so that both the power levels on the individual drives and the system level power supply are controlled in a closed loop process. In addition to temperature, other factors that performance and power, such as aging, can also be incorporated.

Figure 14:
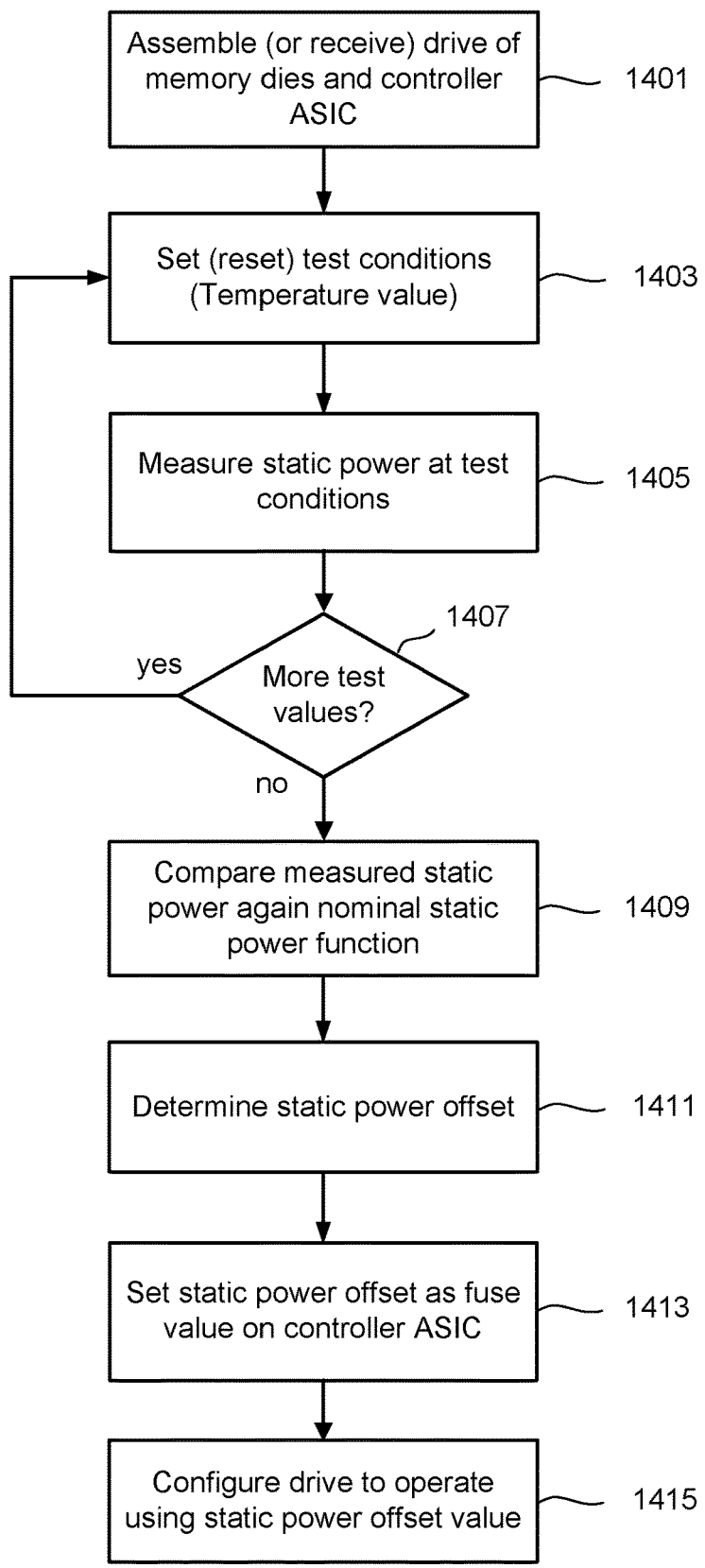
FIG. 14 is a flowchart describing one embodiment of a process for determining and using the static power offset.
Figure 15:
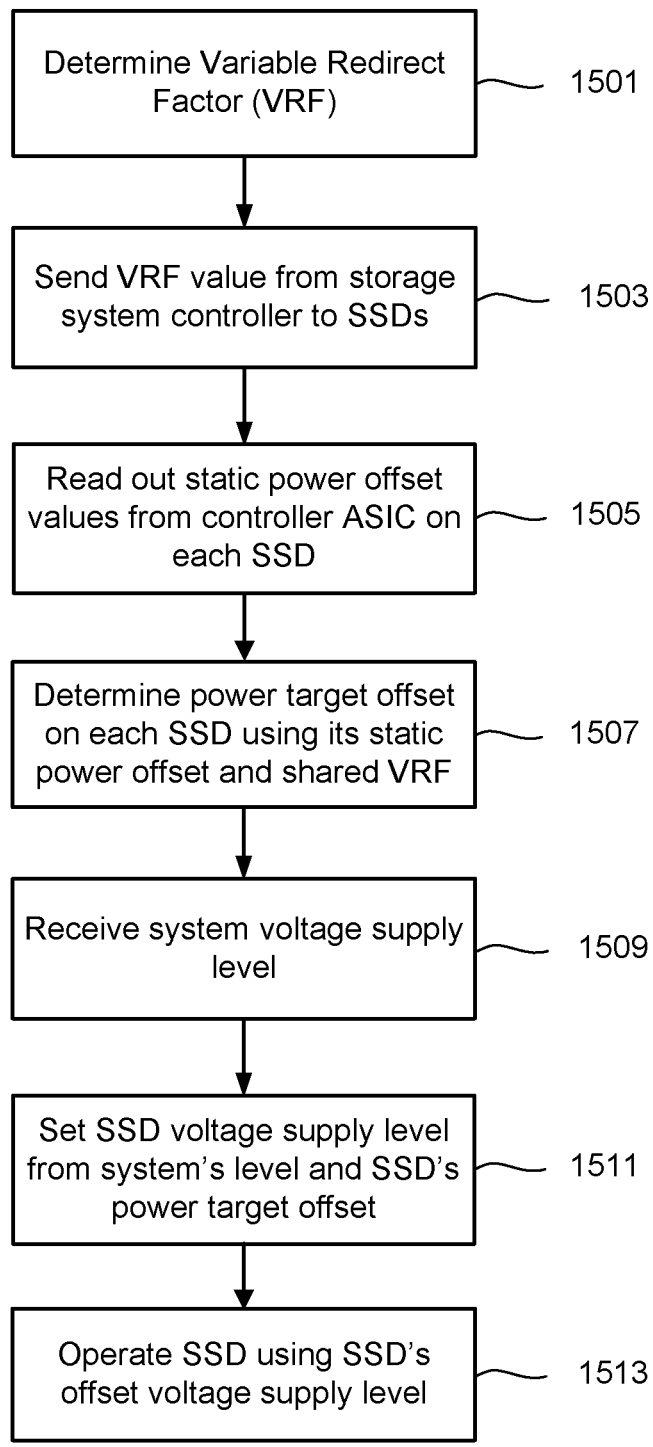
FIG. 15 is a flowchart describing one embodiment of a process for determining the power target offset from the static power offset and variable redirect factor.
Figure 16:
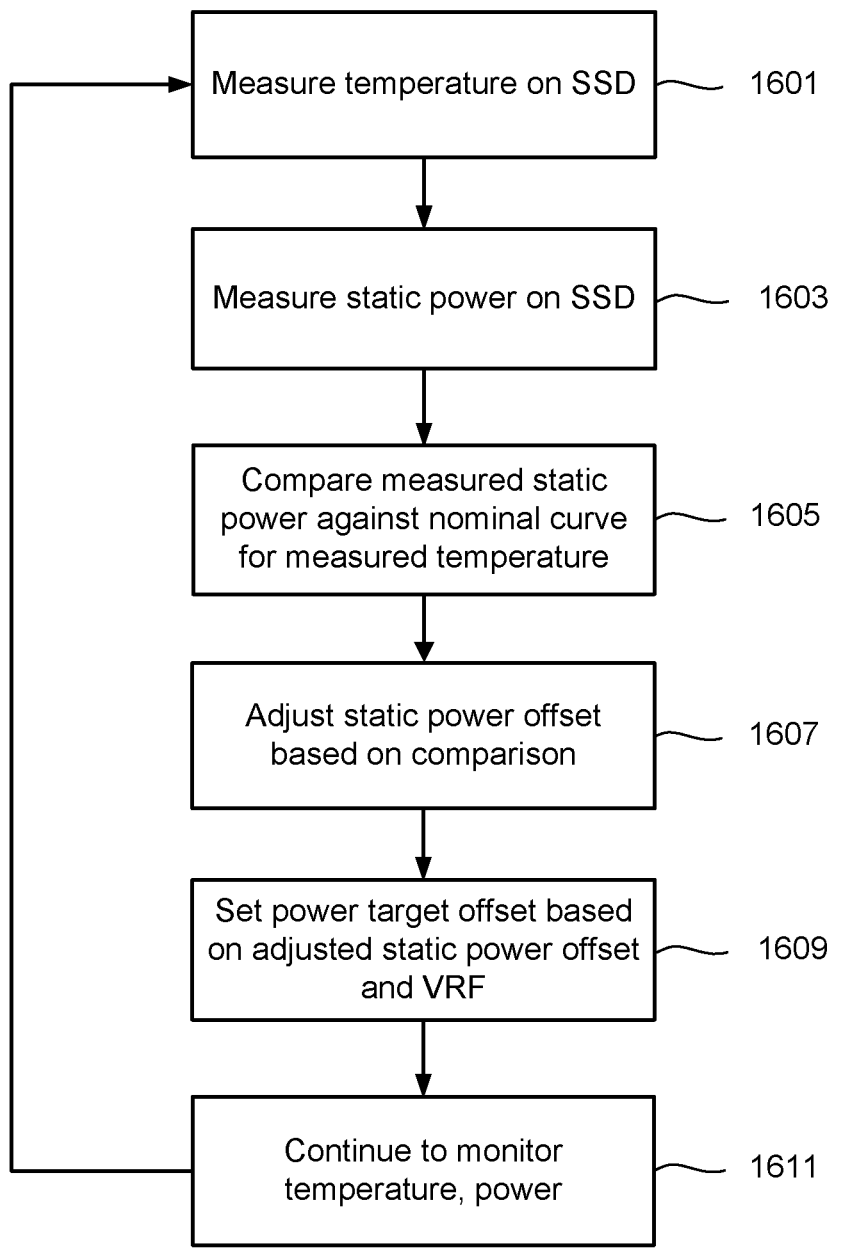
FIG. 16 is a flowchart describing one embodiment of a process to incorporate temperature dependence into a closed loop process for determination of power target calibration.

FIGS. 14-16 are a series of flowcharts that illustrate embodiments for the aspects described above. FIG. 14 is a flowchart describing one embodiment of a process for determining and using the static power offset. At step 1401 an SSD or other memory drive is received or assembled from a set of memory dies and one or more controller ASICs, such as illustrated for the memory system 100 of FIGS. 1-5. Test conditions, that can include a temperature value, for the drive are set at step 1403 and the static power of the drive in an idle state for the test conditions is determined at step 1405. The testing of step 1405 can be performed as part of the testing typically performed on an SSD prior to shipping out to customers, but extended to include a measurement of static power. If the drive is to be characterized at more conditions at step 1407, such as additional temperature values, the flow loops back to step 1403 and the conditions temperature or other test conditions are reset before going on to step 1405. Once the static power has been determined at all the test conditions, the flow moves from step 1407 to step 1409.

At step 1409 the static power value (or values) are compared against a nominal static power function. The nominal static power function can have been previously determined based a set of other drives in a device characterization process or the drive being tested at step 1405 can be one of the population used to establish or update the nominal static power function. Depending on the embodiment, step 1409 can be a single comparison or several comparisons, such as multiple temperature values. Based upon the comparison of step 1409, the static power offset (SPO) is determined for the drive at step 1411, where this can again be a single value or multiple values corresponding to different temperatures or other operational variables. At step 1413 the static power offset parameter value or values can be stored in ROM or other memory used by the drive controller 102 to store operating parameters, such as a fuse value indicated at 143 on a drive controller ASIC 102. Once the static power offset parameter value or values are stored on the drive, at step 1415 the drive is configured or has previously been configured to use the static power offset as describe with respect to FIG. 15.

FIG. 15 is a flowchart describing one embodiment of a process for determining the power target offset from the static power offset and variable redirect factor. The use of the static power offset can be used in embodiments that do not also use a variable redirect factor, where the voltage levels provided from the drives power module PMIC 105 is scaled directly from the static power offset, Vcc(SPO). Other embodiments can incorporate the variable redirect factor to allow for a choice between consistency in power output and performance. At step 1501 the variable redirect factor, or VRF, is determined by the storage system controller 603. This can be a parameter stored on the storage system controller 603, or a user input from the computer system 645. For example, the storage system controller 603 can store a user provided value that the data storage system 601 can continue to use until updated by a new value.

At step 1503 the storage system controller 603 sends the VRF value to the SSDs 100. For example, a firmware algorithm running on the storage system controller 603 can send out the VRF values, where the VRF value can be the same for all of the SSDs 100, or, in some embodiments, different SSDs can receive different values. If a user places more value on full performance, and is less concerned about variation, VRF can be set to zero. If, instead, consistency is considered more than performance, VRF is set to one. For a user wanting a balance, an intermediate value can be used. In most embodiments, the same value would be used for all drives for a given customer. The management module 635 can perform these function through one or more of hardware, firmware and software running on the one or more CPUs 637.

At step 1505 the drive controller 102 on each of the SSDs 100 reads out the corresponding static power offset from its parameter values 143. Each of the drives then determines its target offset based upon the VRF value received from the storage controller 603 and its corresponding static power offset at step 1507, where this can be simple scaling of PTO=SPO*VRF or other functional relation. Step 1507 and the other steps performed on the memory drive 100 can be performed by the drive controller 102 and other control circuits on the drive through various combinations of hardware elements, firmware and software, such through firmware on the processors 220/250 and 156.

In step 1509 the individual SSDs 100 receive the data storage system supply level from the system power module 611. From the storage system supply level Vcc and drive's power target offset, the power module PMIC 105 of each drive can determine its corresponding power target level Vcc(PTO) at step 1511. The SSD is subsequently operated using the determined power target level Vcc(PTO) at step 1513.

FIG. 16 is a flowchart describing one embodiment of a process to incorporate temperature dependence into a closed loop process for determination of power target calibration. At step 1601 the temperature on the drive is measured by a temperature sensor on the drive, such as one or more of the temperature sensor 141 on the controller ASIC or temperature sensor 317 on the memory dies. An on-board power sensor 145 determine the static power level of the drive at step 1603. Based on the measured temperature and power values, at step 1605 the static power/temperature curve like that discussed above with respect to FIG. 13 can be used to determine the offset value by comparing the measured static power for the measured temperature with the nominal static power curve for that temperature. For the nominal static power curve, the drive controller 102 can base this on a plurality of static power offset values corresponding to different temperature values or, in other embodiments, a functional relation. For example, the drive controller can have nominal static power values stored for multiple temperature values and use these to extrapolate/interpolate values for the static power versus temperature curve.

At step 1607, the SSD controller 102 adjusts the static power offset based on the comparison of step 1605. The adjusted value of the static power offset and the variable redirect factor are then used to set the power target calibration for the measured temperature value at step 1609. At step 1611 the flow can loop back to step 1601 to continue to monitor the temperature and power values in a closed loop. The looping back at 1611 can be performed periodically based on time or in response to determined amount of change in temperature, for example.

The techniques presented here can be used to achieve uniform performance, including by the use of closed loop control throttling, whereas closed loop throttling and uniform performance have been mutually exclusive in previous techniques. The use of a scale factor (VRF) allows for the system to manage the inherent variation in the static power of the controller to be manifested either as power variation, performance variation, or some level of each depending on the application. Compared to other means of controlling variation, such as an open loop power throttling, the described power target calibration maintains the advantages of closed loop power throttling: The power limits can be more tightly enforced due to automatic adjustment for temperature, aging, and other variables. Whereas closed loop power throttling was not practical for many low-power applications due to the performance variation, power target calibration makes closed loop control advantageous (i.e. dynamically accounting for temperature, workload, and age, removing margins), even in power limited configurations where tight performance uniformity is required.

One embodiment includes an apparatus having one or more non-volatile memory dies and one or more control circuits connected to the one or more non-volatile memory dies. The one or more control circuits are configured to maintain one or more first power offset parameter values, receive an external voltage supply level, and generate an internal voltage supply level by offsetting the external voltage supply level by an amount based on the first power offset parameter values. The one or more control circuits are further configured to operate the one or more non-volatile memory dies and the one or more control circuits using the internal voltage supply level.

One embodiment includes a method that includes measuring a first amount of power drawn by a non-volatile memory drive when in an idle state and performing a comparison of the first amount of power to a first nominal power value. Based on the comparison of the first amount of power to the first nominal power value, the includes determining a first static power offset value for the memory drive. The method further includes storing the first static power offset value as a parameter value on the memory drive and configuring the memory drive to offset a received power supply level based on the first static power offset value and operate the memory drive using the offset power supply level.

One embodiment includes a data storage system that includes a system power supply and multiple of non-volatile memory drives. The system power supply is configured to provide a system voltage supply level. The plurality of non-volatile memory drives are connected to receive the system voltage supply level. Each of the non-volatile memory drives configured to: maintain a corresponding individually settable power offset value; generate a corresponding internal voltage supply level by offsetting the system voltage supply level by an amount based on the corresponding power offset value; and operate the non-volatile memory drive using the corresponding internal voltage supply level.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
  one or more non-volatile memory dies;
  a temperature sensor configured to determine a temperature value of the apparatus;
  a power sensor configured to determine a static power value for an amount of power consumed by the apparatus in an idle state; and
  one or more control circuits connected to the one or more non-volatile memory dies and configured to:
    maintain one or more first power offset parameter values;
    receive an external voltage supply level;

generate an internal voltage supply level by offsetting the external voltage supply level by an amount based on the first power offset parameter values;

operate the one or more non-volatile memory dies and the one or more control circuits using the internal voltage supply level; and determine the amount by which the external voltage supply level is offset from the determined temperature value and the determined static power value by a comparison of the determined static power value with a nominal static power value corresponding to the determined temperature value.

2. The apparatus of claim 1, wherein the one or more control circuits are further configured to:

receive a scale factor; and scale the offsetting of the external voltage supply level by the scale factor.

3. The apparatus of claim 2, wherein:

the scale factor has a value in a range of zero to one;

a value of zero corresponds to no offset of the external voltage supply level; and a value of one corresponds to offsetting the external voltage supply level by a full amount of one of the first power offset parameter values.

4. The apparatus of claim 1, wherein the one or more first power offset parameter values are a plurality of first power offset parameter values, each corresponding to a temperature value, wherein the one or more control circuits are further configured to:

select one of the first power offset parameter values based on the temperature value; and offset the external voltage supply level by an amount based on the selected first power offset parameter value.

5. The apparatus of claim 1, wherein the one or more non-volatile memory dies and the one or more control circuits are part of a first solid state drive, the apparatus further comprising:

one or more second solid state drives each configured to:

maintain a corresponding one or more second power offset parameter values;

receive the external voltage supply level;

generate a corresponding internal voltage supply level by offsetting the external voltage supply level by an amount based on the corresponding second power offset parameter values; and operate each of the second solid state drives using the corresponding internal voltage supply level, wherein the first and second power offset parameter values are respectively independently settable for each of the first and second solid state drives.

6. The apparatus of claim 5, further comprising:

a system power supply configured to provide the external voltage supply level; and a storage system controller connected to the system power supply and to the first and second solid state drives, the storage system controller configured to provide the first and second solid state drives with a common scale factor, wherein each of the first and second solid state drives are further configured to scale the corresponding offsetting of the external voltage supply level by the scale factor.

7. The apparatus of claim 6, wherein the storage system controller is further configured to:

receive a user input; and set a value of the common scale factor in response to the user input.

8. The apparatus of claim 6, wherein the storage system controller is further configured to:

monitor a cumulative power level used by the first and second solid state drives; and adjust the external voltage supply level provided by the system power supply based on the cumulative power level.

9. The apparatus of claim 1, wherein the one or more control circuits are further configured to maintain one or more first power offset parameter values as a corresponding one or more fuse values.

10. A data storage system, comprising:

a system power supply configured to provide a system voltage supply level; and a plurality of non-volatile memory drives connected to receive the system voltage supply level, each of the non-volatile memory drives comprising:

a temperature sensor configured to determine a corresponding temperature value for the non-volatile memory drive; and a power sensor configured to determine a corresponding static power value for an amount of power consumed by the non-volatile memory drive in an idle state, each of the non-volatile memory drives configured to:

maintain a plurality of corresponding individually settable power offset values each corresponding to one of a plurality of temperature values;

select a first of the corresponding individually settable power offset values based on the corresponding temperature value;

generate a corresponding internal voltage supply level by offsetting the system voltage supply level by an amount based on the first of the corresponding power offset values; and operate the non-volatile memory drive using the corresponding internal voltage supply level.

11. The data storage system of claim 10, further comprising:

a storage system controller connected to the system power supply and to the non-volatile memory drives, the storage system controller configured to provide the non-volatile memory drives a common scale factor, wherein each of the non-volatile memory drives are further configured to scale the corresponding offsetting of the system voltage supply level by the common scale factor.

12. The data storage system of claim 11, wherein:

the common scale factor is a value in a range of zero to one;

a value of zero corresponds to no offset of the system voltage supply level; and a value of one corresponds to offsetting the system voltage supply level by a full amount of the corresponding first of the power offset values.

13. The data storage system of claim 11, wherein the storage system controller is further configured to:

receive a user input; and set a value of the common scale factor in response to the user input.

14. The data storage system of claim 11, wherein the storage system controller is further configured to:

monitor a cumulative power level used by the plurality of non-volatile memory drives; and adjust the system voltage supply level provided by the system power supply based on the cumulative power level.

15. The data storage system of claim 10, wherein each of the non-volatile memory drives comprises:
a plurality of non-volatile memory dies; and
a drive controller configured to maintain the corresponding power offset values as a fuse value.

16. A data storage system, comprising:
means for providing a system voltage supply level; and
a plurality of non-volatile memory drives connected to receive the system voltage supply level, each of the non-volatile memory drives comprising:
  means for determining a corresponding temperature value for the memory drive;
  means for determining a corresponding static power value for an amount of power consumed by the non-volatile memory drive in an idle state;
  means for maintaining a plurality of corresponding individually settable power offset values each corresponding one of a plurality of temperature values;
  means for selecting a first of the corresponding individually settable power offset values based on the corresponding temperature value;
  means for generating a corresponding internal voltage supply level by offsetting the system voltage supply level by an amount based on the first of the corresponding power offset values; and
  means for operating the non-volatile memory drive using the corresponding internal voltage supply level.

* * * * *